United States Patent [19]
Clements et al.

[11] Patent Number: 5,707,282
[45] Date of Patent: Jan. 13, 1998

[54] FAN DIFFUSER

[75] Inventors: Brad E. Clements, Fort Collins; Theodore R. Santos, II, Boulder, both of Colo.

[73] Assignee: Hewlett-Packard Company, Palo Alto, Calif.

[21] Appl. No.: 608,382

[22] Filed: Feb. 28, 1996

[51] Int. Cl.$^6$ .................................................. H05K 5/00
[52] U.S. Cl. ............................ 454/184; 361/687; 361/690
[58] Field of Search ........................... 454/184; 361/687, 361/690, 692, 693, 694, 695; 165/80.3

[56] References Cited

U.S. PATENT DOCUMENTS

| | | |
|---|---|---|
| 4,194,556 | 3/1980 | Watanabe et al. |
| 4,233,644 | 11/1980 | Hwang et al. |
| 4,489,363 | 12/1984 | Goldberg . |
| 4,517,880 | 5/1985 | Buckner et al. ........................ 454/184 |
| 5,107,398 | 4/1992 | Bailey .................................... 361/687 |
| 5,171,183 | 12/1992 | Pollard et al. ......................... 454/184 |
| 5,191,230 | 3/1993 | Heung . |
| 5,456,632 | 10/1995 | Ohtsu et al. ........................... 454/184 |

*Primary Examiner*—Harold Joyce
*Assistant Examiner*—Derek S. Boles

[57] ABSTRACT

A cooling system for electronic component cases is disclosed. The system includes a fan diffuser located between the exhaust fan and the exhaust grill formed in an exterior wall of the case. The diffuser allows the grill to vary in both size and shape from the fan, thus allowing the grill footprint to differ from that of the fan. This arrangement allows the grill size to be optimized, taking advantage of the available space on the case wall. The diffuser also allows components to be located between the fan and the case wall portion where the grill is located.

25 Claims, 4 Drawing Sheets

FAN DIFFUSER

FIELD OF THE INVENTION

The present invention relates generally to a cooling system for an electronic device housing and, more particularly, to a fan diffuser used in such a cooling system.

BACKGROUND OF THE INVENTION

Electronic devices are increasingly being used in modern applications; one prevalent example is the personal computer. Such electronic devices generally include electronic components mounted within the interior of a housing or case. In addition to housing the electronic components, the case generally also provides, on its exterior surfaces, terminals for connecting to peripheral devices (such as printers, keyboards, monitors, etc.) as well as various user interface features (such as disk drives, power switches, etc).

During normal operation, electronic components may generate significant amounts of heat. If this heat is not continuously removed, the electronic components may overheat, resulting in damage to the components and/or a reduction in operating performance of the electronic device.

In order to avoid such overheating, air is often circulated through electronic device cases. To provide this air circulation, electronic device cases are generally provided with an exhaust opening, usually located in the rear wall of the case. A fan is typically located inside the case against the exhaust opening such that, when energized, the fan forces air out of the case through the exhaust opening. This, in turn, causes air to enter the case through various intake openings strategically located around the periphery of the case.

In this manner, air is caused to flow from the intake openings through the case to the exhaust opening. As the air flows, it circulates over and around the electronic components housed within the case, thus cooling the components and removing heat from the case.

Many electronic components inherently emit electromagnetic radiation which may cause interference with communication devices, such as telephones, radios, and televisions. Accordingly, most electronic device cases are designed to block electromagnetic radiation and thus prevent the escape of electromagnetic radiation from the case. In most instances, electronic device cases are formed of metal for this purpose.

Because the cooling air exhaust opening breaches the case wall, it provides a break in the electromagnetic radiation shield. In order to minimize the effect of this break, exhaust openings are generally constructed in a grill configuration consisting of a plurality of smaller openings, rather than one large opening. It has been found that a plurality of smaller openings will emit less electromagnetic radiation than a single larger opening having the same opening area. It has further been found that the smaller the individual openings in the grill, the less electromagnetic radiation will be emitted for a given total opening area.

Over the years, the power and sophistication of computers and other electronic devices have steadily increased. Along with this increase has come an increase in heat generated by the components and also an increase in electromagnetic radiation emitted by the components.

This increase in electromagnetic radiation has forced the size of the individual openings in the exhaust grill to be further reduced in order to adequately constrain the emission of electromagnetic radiation through the grill. Reducing the individual opening size in this manner results in an enlargement of the required footprint size of the grill in order to maintain the same overall grill opening area. This enlargement is primarily due to the fact that the size of the interstitial areas between the individual openings cannot be reduced beyond a certain point for structural reasons.

In order to adequately remove the increased heat generated by modern electronic devices, it is also necessary to provide larger exhaust opening areas in order to allow for greater air flow through the case. Accordingly, it can be appreciated that the increase in generated heat and electromagnetic radiation combine to necessitate larger exhaust grill footprint areas.

The back panels of electronic device cases have become increasingly crowded over the years. Located on the back panel, for example, are usually found connectors for power supplies, monitors, keyboards, printers, etc. Accordingly, air exhaust openings must compete for limited available space on the back panel. In addition, the interiors of electronic device cases have also become more crowded. This is particularly true adjacent to the rear wall of the case where many interface features, such as previously mentioned, are located. This increase in interior crowding has made it increasingly difficult to locate an exhaust fan against the interior of an electronic device case rear wall in a conventional manner.

A further constraint on the space available for exhaust grills is that most exhaust fans used in electronic cases are rotary fans, thus dictating a circular footprint. Such a circular footprint means that the width of the grill, for example, cannot exceed the height of the grill. This constraint often prevents optimum utilization of available back panel space. Available space often, for example, may have a width which is not equal to its height.

Accordingly, providing adequate air exhaust mechanisms for electronic device cases has become increasingly difficult and, in some modern, high power applications, virtually impossible using the conventional air exhaust mechanisms previously described.

Thus, it would be generally desirable to provide an apparatus which overcomes these problems associated with electronic case cooling devices.

SUMMARY OF THE INVENTION

The present invention is directed to a cooling system for electronic component cases. The system includes a fan diffuser located between the exhaust fan and the exhaust grill.

The diffuser has a first, inlet end, being of substantially the same size as the exhaust fan. The diffuser also has a second, outlet end which may be larger than the fan in order to adapt to a larger exhaust grill area. Accordingly, the diffuser allows the grill size to vary from the size of the fan and the grill size is, thus, not limited to a projection of the fan footprint.

The outlet end of the diffuser also may have a different shape than the inlet end. Thus, while the shape of the inlet end will generally conform to the shape of the fan, the outlet end may assume virtually any shape in order to take advantage of the available space on the case wall where the exhaust grill is to be located. Accordingly, the diffuser allows the exhaust grill to assume any desired shape, independent of the shape of the fan being used.

The diffuser also provides for spacing between the fan and the exhaust grill. This space allows air coming off of the fan blades to slow down and stabilize, thus resulting in a more uniform distribution of air speed across the grill area. This more uniform distribution results in a higher overall efficiency of the exhaust system. The spacing described above also allows other components, such as connectors, to be located between the fan and the case wall where the exhaust grill is to be located.

The diffuser may be provided with a hinge mechanism. A corresponding hinge mechanism may be provided on the interior of the case wall where the exhaust grill is to be located. In this manner, the diffuser may be hingedly attached to the electronic component case, enabling easy attachment to and removal from the case wall of the diffuser assembly without the need for tools. This hinged attachment also allows for easy access to components, such as connectors, which may be located between the fan and the case wall.

The diffuser may be provided with quick-release clips to securely, but releasably, hold the fan against the diffuser and may also be provided with guide posts to locate the fan with respect to the diffuser. A wire guide may be provided to prevent damage to the fan electrical wires when the diffuser is being installed and pivoted about its hinge mechanism relative to the case wall.

DETAILED DESCRIPTION OF THE INVENTION

Figure 1:
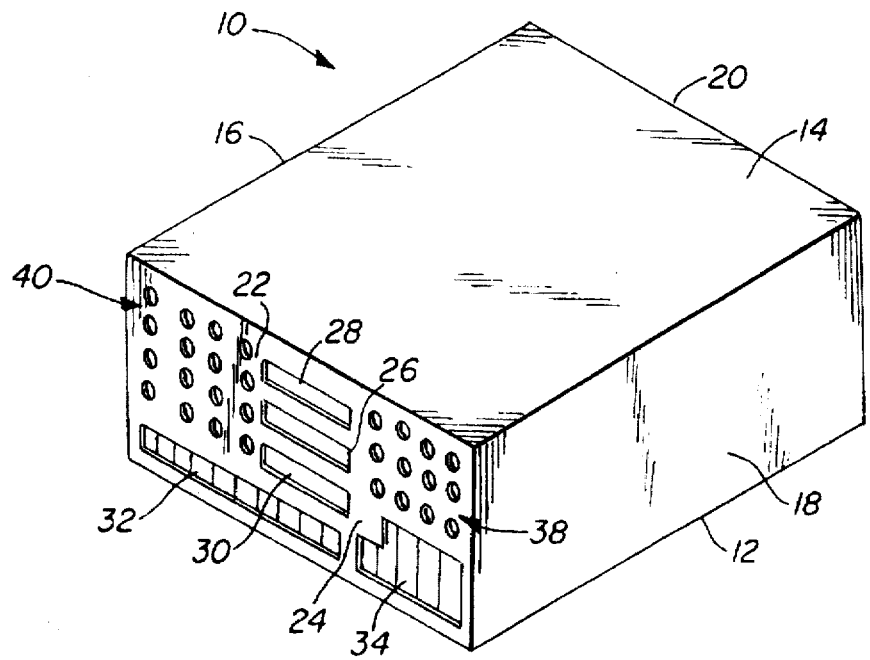
FIG. 1 is a top perspective view of an electronic device case having a fan diffuser.

FIGS. 1–7, in general, illustrate a cooling system for a computer or the like. The cooling system includes a substantially closed container 10 formed of at least a first wall section 22. The container 10 has an interior and an exterior. A grill 38, 40 is formed in the first wall section 22. The grill 38, 40 includes at least one opening 42 extending through the first wall section 22 between the interior and the exterior of the container 10. A diffuser 80 is located within the container 10. The diffuser 80 has a first end portion 82 and a second end portion 84. The diffuser second end portion 84 is located adjacent the grill 38, 40. An air movement device 240 is located adjacent the diffuser first end portion 82.

FIGS. 1–7 also illustrate, in general, a diffuser 80 for use in the case 10 of a computer or the like. The diffuser 80 includes a first open end 82 adapted to engage an air movement device 240. The first open end 82 has first area. A second open end 84 is adapted to engage a wall section 22 of the case 10. The second open end 84 has a second area. The diffuser also includes a first wall portion 86, a second wall portion 92 opposite the first wall portion 86, a third wall portion 98 connecting the first wall portion 86 and the second wall portion 92, and a fourth wall portion 104 opposite the third wall portion 98. The fourth wall portion 104 also connects the first wall portion 86 and the second wall portion 92. The wall portions 86, 92, 98, 104 each include a first edge portion 138, 136, 122, 130, 118, 126 and a second edge portion 110, 112, 114, 116. The first edge portions 138, 136, 122, 130, 118, 126 substantially define the diffuser first open end 82 and the second edge portions 110, 112, 114, 116 substantially define the diffuser second open end 84. The first area differs from the second area.

FIGS. 1–7 also illustrate, in general, a method of circulating air through the case 10 of a computer or the like, comprising the steps of providing a grill 38, 40 in a wall 22 of the case 10, the grill 38, 40 including a plurality of openings 42 and spaces 62 between the openings 42; providing an air movement device 240; providing a diffuser 80 having an intake opening 82 and an exhaust opening 84; locating the diffuser 80 between the air movement device 240 and the grill 38, 40; and activating the air movement device 240 to cause air to move into the diffuser intake opening 82, through the diffuser 80, out of the diffuser exhaust opening 84 and thereafter out of the case 10 through the grill 38, 40.

Having thus described the cooling system in general, the system will now be described in further detail.

FIG. 1 illustrates an electronic device case 10 for use in housing electronic components. Case 10 may be, for example, of the type used to house personal computer electronic components. Case 10 may have a bottom wall section 12, an upper wall section 14, a first side wall section 16, a second side wall section 18, and a front wall section 20. First sidewall section 16, second sidewall section 18 and top wall section 14 may be formed as an integral unit in a conventional manner.

Figure 2:
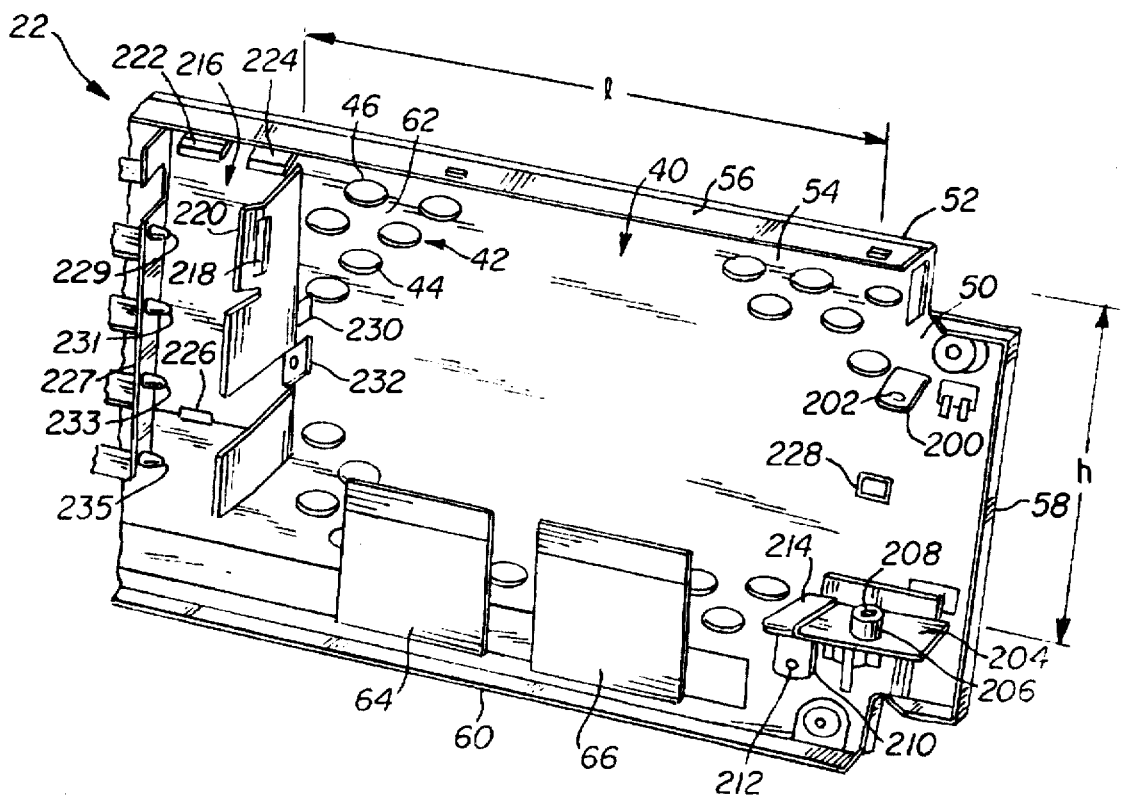
FIG. 2 is a top perspective view of an inside portion of a wall section of the case of FIG. 1 with the fan diffuser removed.

Case 10 also includes a rear wall section 22 having an outer surface 24 and an inner surface 50, FIG. 2. Various interface devices may extend through the rear wall section 22, terminating at the rear wall section outer surface 24. Examples of such interface devices are card slots, such as the slots schematically illustrated by reference numerals 26, 28, 30 and various terminal connectors, such as the connectors schematically illustrated by the reference numerals 32 and 34. Card slots 26, 28 and 30 may be provided to allow the addition of various electronic circuitry in order to enhance the functionality of the electronic device housed within the case 10 in a conventional manner. The connectors 32, 34 may be provided to allow the electronic device housed within case 10 to be connected to various peripheral devices, e.g. printers, keyboards and monitors, also in a conventional manner.

Rear wall section 22 may also be provided with a grill or grills 38, 40. The grills 38, 40 each include a plurality of holes 42, such as the individual holes 44, 46, FIG. 2. The holes 42 extend through the rear wall section 22, joining the rear wall section outer and inner surfaces 24, 50. The grills 38, 40, thus, provide airflow paths through the rear wall section 22, placing the interior of the case 10 in fluid communication with the exterior of the case.

To cool the electronic components located in the case 10, air may be forced from the grills 38, 40 from the interior of the case 10 to the exterior. This, in turn, causes air to enter the case through various intake openings strategically located around the periphery of the case. Such intake openings, not shown, may be located, for example, on the front wall section 20 of the case 10 in a conventional manner.

In this manner, air may be induced to flow into the case 10 through the intake openings, then through the case and finally exhausting through the grills 38, 40. As the air flows through the case 10, it circulates over and around the electronic components housed within the case, thus cooling the components and removing heat from the case.

FIG. 2 shows a portion of the rear wall section inner surface 50 illustrating details of the grill 40. It is noted that, although FIG. 2 shows only the grill 40 for clarity, the following description may apply to the grill 38 as well.

As can be seen from FIG. 2, rear wall section 22 may be constructed from an outer plastic layer 52 and an inner metallic layer 54 which provides structural strength to the case 10 in a conventional manner.

As previously described, electronic components, such as the components which may be housed in the case 10, commonly emit electromagnetic radiation. The provision of inner metallic layer 54, in addition to providing structural strength, also serves to prevent or reduce the escape of such electromagnetic radiation from the case 10. To further inhibit such escape, inner metallic layer 54 may actually be formed as a two-part assembly, having a relatively thin electromagnetic blocking layer attached to a relatively thick structural metallic layer. Such construction of electronic device case wall sections is conventional and well-known in the industry.

Inner metallic layer 54 may include forwardly extending flanges 56, 58 and 60 which facilitate connection of the rear wall section 22 to the case top wall section 14, first sidewall section 16 and bottom wall section 12, respectively, in a conventional manner.

With further reference to FIG. 2, it can be seen that the grill 40 covers a total area having a length "l" and a height "h". This area includes the total area of the holes 42 as well as the total area of the interstitial regions, such as the interstitial region 62 located between the holes 42. The total area of grill 40 may be referred to herein as the grill "footprint" or grill "footprint area". The total open area, i.e., the combined area of all of the holes 42 in the grill, may be referred to herein as the grill "open area". The total interstitial region area, i.e., the combined area of all of the interstitial regions in the grill, may be referred to herein as the "interstitial area". As can be appreciated, the grill open area and the grill interstitial area added together will always yield the grill footprint area.

While the holes 42 allow the passage of air through the rear wall section 22, they also allow the escape of electromagnetic radiation, as previously described, from the case 10. It has been found, however, that, for a grill having a given open area, reducing the size of the holes in the grill will reduce the amount of electromagnetic radiation which can escape through the grill. In other words, the escape of electromagnetic radiation can be reduced by providing more holes of smaller individual area.

It has also been found, however, that, for structural reasons, it is impractical or impossible to reduce the size of the individual interstitial regions 62 beyond a certain point. Accordingly, the practice of reducing the size of individual holes and increasing the number of holes, as described above, results in a larger interstitial area and, thus, a larger grill footprint. In other words, when using more holes having smaller individual areas, a larger grill footprint is generally required in order to maintain the same opening area.

Over the years, the number and power of components housed in cases such as the case 10 has increased. This increase has, in turn, resulted in both an increase in electromagnetic radiation and an increase in generated heat. To address these increases, it is necessary to provide grills having greater open areas to allow adequate heat removal. It is also necessary, however, to provide grills having smaller individual hole sizes, to reduce the emission of electromagnetic radiation from the case. As previously discussed, both of these factors contribute to the need for grills with larger grill footprints.

As the need for larger grill footprints has increased, however, so has competition for space on the rear wall section 22. Referring to FIG. 1, it can be seen that the rear wall section 22 commonly houses various user interface devices, such as the slots 26, 28, 30 and the connectors 32 and 34. These interface devices occupy space on rear wall section 22 that would otherwise be available for air exhaust grills. Accordingly there is an increasing need to take maximum advantage of the remaining open space on the rear wall section 22 for use as grill surfaces.

Referring again to FIG. 2, it can be seen that the grill 40 has a length "l" which is substantially greater than its height "h". The length "l" may be, for example about 135 mm and the height "h" may be, for example, about 75 mm. In conventional applications, where a rotary exhaust fan is mounted directly to rear wall section inner surface 50, it would be necessary to form the grill opening having a circular or square configuration having a diameter no greater than the height "h" of the grill 40, since the grill footprint would be constrained to the size of the fan. This would result in a relatively small fan and an even smaller grill open area.

Figure 7:
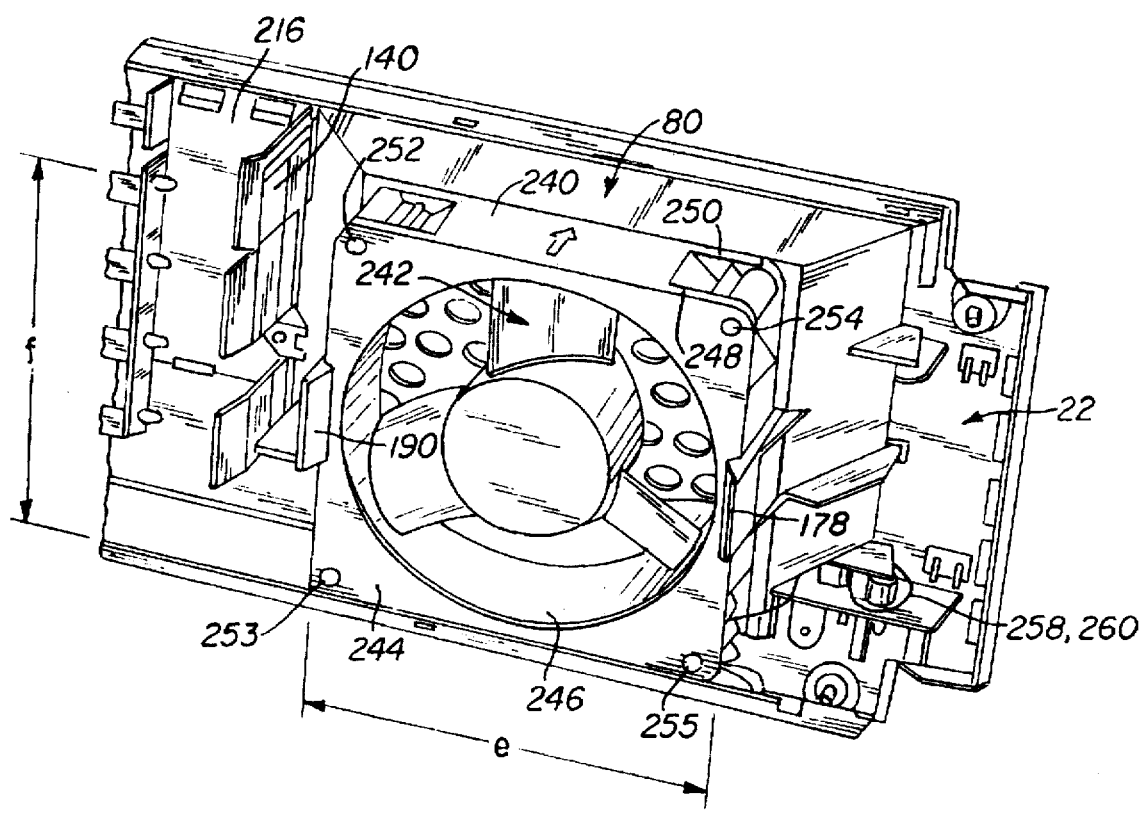
FIG. 7 is a top perspective view of an inside portion of a wall section of the case of FIG. 1 with the fan diffuser installed.

The grill 40, however, as shown in FIG. 2, takes advantage of the available space in rear wall section 22 that is not be occupied by connectors, etc. Referring to FIG. 2, it can be seen that the height "h" of the grill 40 is located between the rear wall section upper flange 56 and the interior portions 64, 66 of the connectors 32. The length "l" however, assumes a longer dimension located generally between the rear wall section flange 58 and the slots 26, 28, 30. The grill 40 is able to assume a non-circular footprint by employing a diffuser 80 located between the fan 240 and the grill 40, as shown in FIG. 7.

Figure 3:
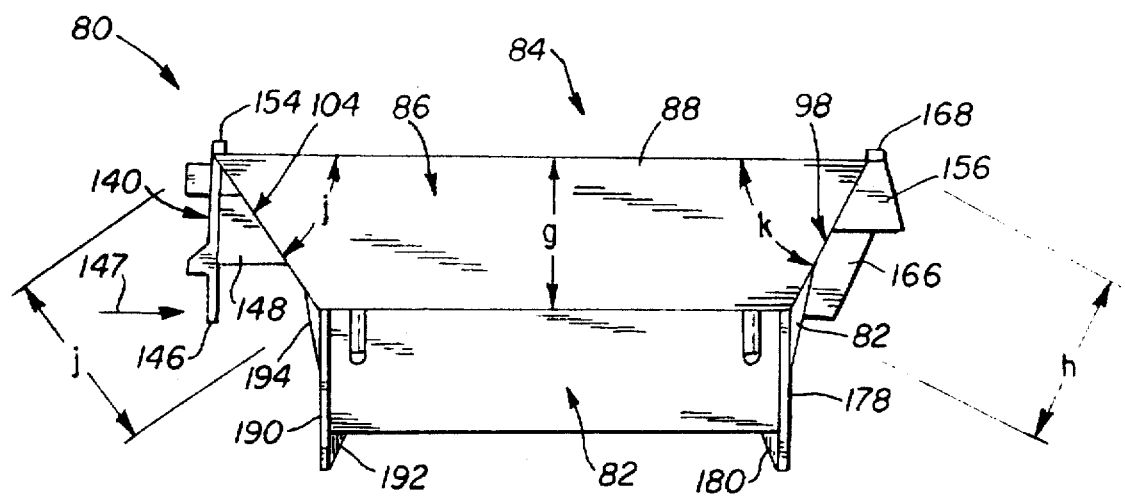
FIG. 3 is a top plan view of the fan diffuser used in the case of FIG. 1.

Referring to FIGS. 3–6, the diffuser 80 includes an intake opening 82 and an exhaust opening 84, FIG. 3. Diffuser 80 may further include a trapezoid-shaped top wall portion 86 having an outer surface 88 and an inner surface 90, FIG. 4. A bottom wall portion 92, which may be parallel to top wall portion 86 and may also be trapezoid-shaped, has an outer surface 94, FIG. 4, and an inner surface 96, FIG. 5. A right side wall portion 98 and a left wall side portion 104 may transversely connect the top and bottom wall portions 86 and 92. Right side wall portion 98 may include an outer surface 100, FIG. 4, and an inner surface 102, FIG. 5. Left side wall portion 104 may include an outer surface 106, FIG. 5, and an inner surface 108, FIG. 4.

Figure 4:
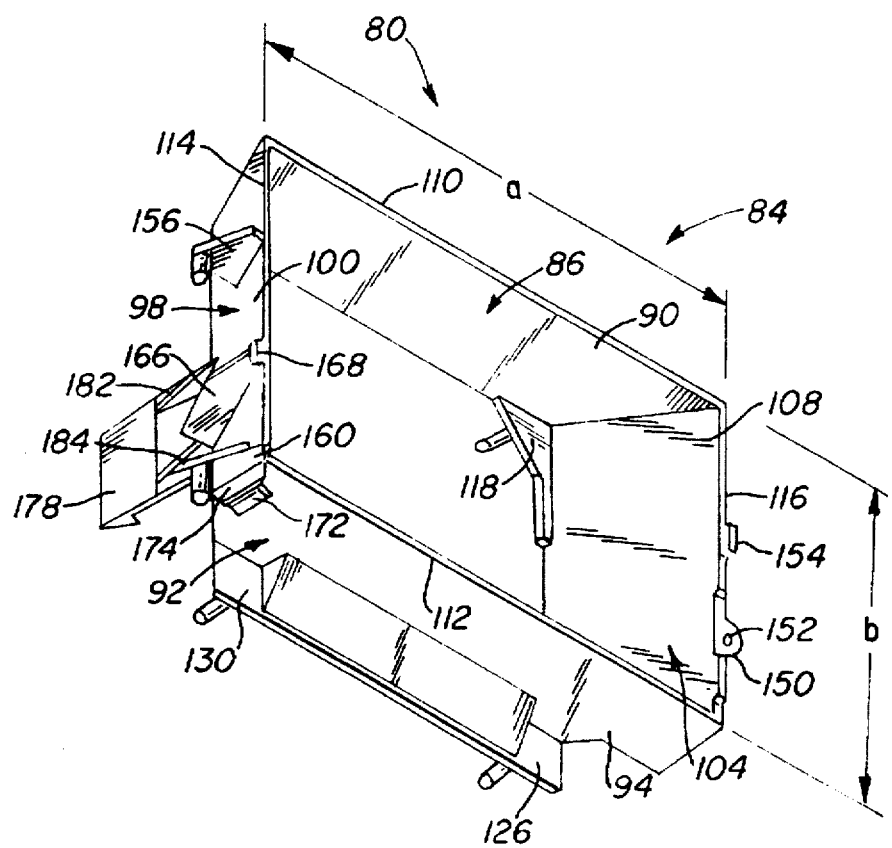
FIG. 4 is bottom perspective view of the fan diffuser of FIG. 3.

With further reference to FIG. 4, it can be seen that the diffuser exhaust opening 84 is defined by edge portions 110, 112, 114, 116 of the wall portions 86, 92, 98 and 104, respectively. The edge portions 110, 112, 114 and 116 may all lie in a common plane which may be perpendicular to the parallel top and bottom wall portions 86 and 92.

Figure 5:
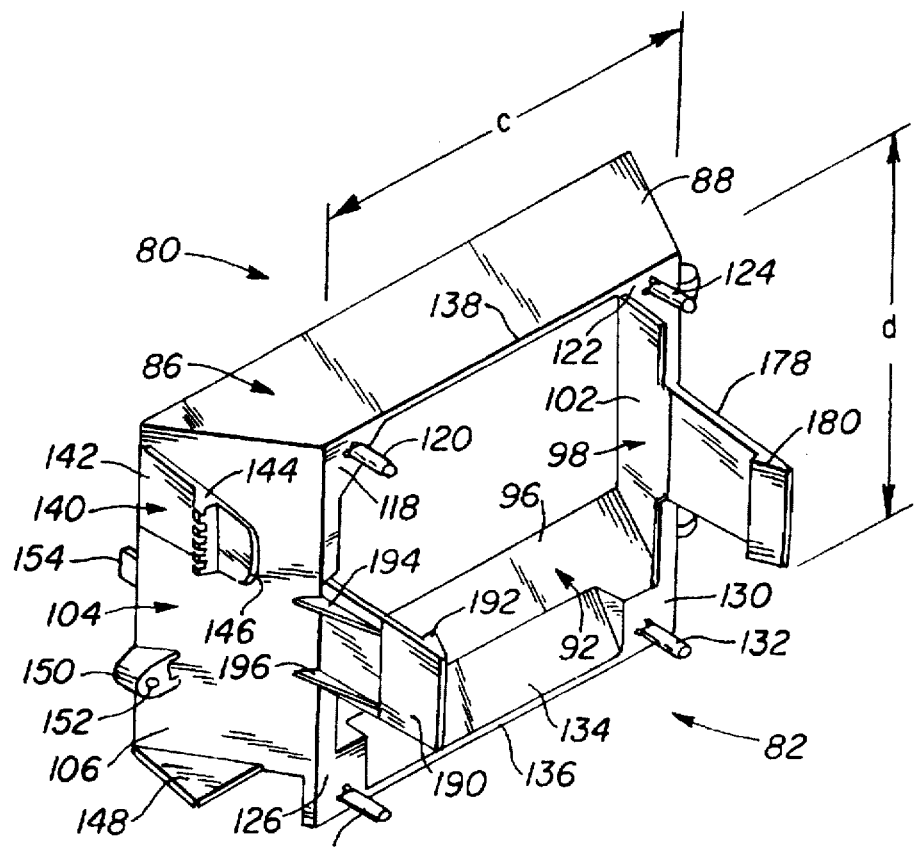
FIG. 5 is rear perspective view of the fan diffuser of FIG. 3.

As best seen from FIG. 5, a flange 118 may span the top wall 86 and the left side wall 104. Flange 118 may be substantially perpendicular to the top wall 86 and bottom wall 92 as shown. A rearwardly extending post 120 may be supported by the flange 118. In a similar manner, a flange 122 may span the top wall 86 and the right side wall 98. Flange 122 may be substantially perpendicular to the top wall 86 and bottom wall 92 and lie in the same plane as the flange 118 as shown. A rearwardly extending post 124 may be supported by the flange 122.

A flange 126 may span the bottom wall 92 and the left side wall 104. Flange 126 may be substantially perpendicular to the top wall 86 and bottom wall 92 as shown. A rearwardly extending post 128 may be supported by the flange 126. In a similar manner, a flange 130 may span the bottom wall 92 and the right side wall 98. Flange 130 may be substantially perpendicular to the top wall 86 and bottom wall 92 and lie in the same plane as the flange 126 as shown. A rearwardly extending post 132 may be supported by the flange 130.

With further reference to FIG. 5, an angled surface portion 134 may extend downwardly from the bottom wall inner surface 96 and terminate in a lower rear edge portion 136. Lower rear edge portion 136 may span the distance between and lie in the same plane as the flanges 126, 130. An upper rear edge portion 138 may be formed on the intake side of the top wall portion 86 and span the distance between the flanges 118 and 122. Upper rear edge portion 138 may lie in a common plane with the lower edge portion 136 and the flanges 118, 122, 126 and 130. Upper rear edge portion 138, lower rear edge portion 136 and the flanges 118, 122, 126, 130, together, generally define the diffuser intake opening Referring again to FIG. 5, the diffuser 80 includes a latch mechanism 140. Latch mechanism 140 comprises an elongated member 142 which extends rearwardly from a forward portion the left side wall portion outer surface 106 as shown. Extending transversely from the elongated member 142 is a catch 144. Beyond the catch 144, the elongated member 142 terminates in a tab portion 146.

Also extending rearwardly and outwardly from the diffuser left side wall portion outer surface 106 is a flange member 148. A block 150, containing a through-hole 152 therein, extends outwardly from the left side wall portion outer surface 106, FIGS. 4 and 5. As can also be seen from FIGS. 4 and 5, a substantially parallelepiped shaped projection 154 may extend forwardly from the left side wall edge portion 116.

Figure 6:
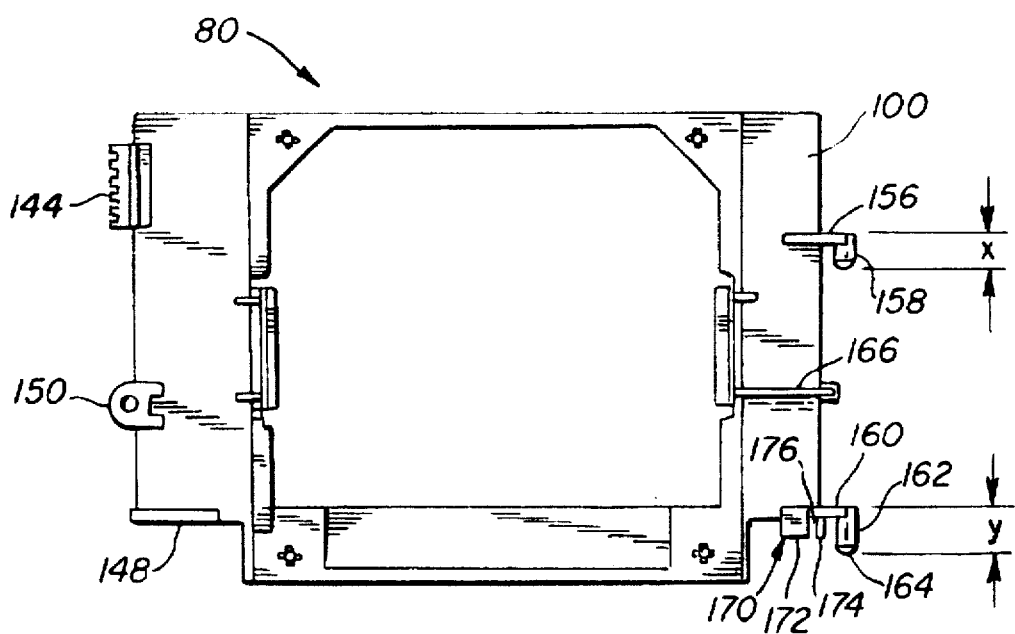
FIG. 6 is a rear elevation view of the diffuser of FIG. 3.

Referring to FIGS. 4 and 6, an upper flange 156 may extend outwardly from the diffuser right side wall outer surface 100. Extending downwardly from the flange 156 is an upper hinge pin 158, FIG. 6. Upper hinge pin 158 may have a length "x" of about 3 mm, FIG. 6. A lower flange 160 may also extend outwardly from the diffuser right side wall outer surface 100. Extending downwardly from the lower flange 160 is a lower hinge pin 162 which may be provided with a tapered portion 164. Lower hinge pin 162 may have a length "y" of about 8 mm, FIG. 6.

A rib 166 may also extend outwardly from the diffuser right side wall outer surface 100, FIGS. 3, 4 and 6. Rib 166 provides structural strength and stability to the diffuser 10. A projection 168 may be formed at the forward edge of the rib 166, FIG. 4.

A wire guide assembly 170 may be formed integrally with lower flange 160, FIGS. 4 and 6. Wire guide assembly 170 may include an L-shaped member 172 and a vertically extending leg 174, forming a slot 176 therebetween as shown in FIG. 4.

As best shown in FIGS. 3–5, diffuser 80 may include a pair of fan clasp members 178, 190. Right fan clasp member 178 may extend rearwardly from a rear portion of the right side wall portion 98, FIG. 5, and may include a catch member 180 located at the terminal end of the clasp member 178. An upper rib 182 and a lower rib 184 may be provided to add strength and/or stiffness to the right fan clasp member 178, FIG. 4. Each rib 182, 184 may extend from an outer portion of the right fan clasp member 178 onto the outer surface 100 of the right side wall portion 98 as shown.

In a similar manner to the right fan clasp member described above, a left fan clasp member 190 may extend rearwardly from a rear portion of the left side wall portion 104 and may include a catch member 192 located at the terminal end of the clasp member 190. An upper rib 194 and a lower rib 196 may be provided to add strength and/or stiffness to the left fan clasp member 190, FIG. 5. Each rib 194, 196 may extend from an outer portion of the left fan clasp member 190 onto the outer surface 106 of the left side wall portion 104 as shown.

Referring to FIG. 4, it can be seen that the diffuser exhaust opening 84 may have a length "a" of about 135 mm and a height "b" of about 79 mm. Referring to FIG. 5, it can be seen that the diffuser intake opening 82 may have a length "c" of about 98 mm and a height "d" of about 92 mm. Referring to FIG. 3, it can be seen that the diffuser 80 may have a depth "g" of about 30 mm, left sidewall portion 104 may have a length "i" of about 37 mm and right sidewall portion 98 may have a length "h" of about 34 mm. With further reference to FIG. 3, it can be seen that the angle "j", formed between the left sidewall portion 104 and the edge portion 100, may be different than the angle "k" formed between the right sidewall portion 98 and the edge portion 110. These different angles allow the diffuser intake opening 82 to be offset from the diffuser exhaust opening 84 to accommodate and allow clearance for various components that may be located within the case 10 in close proximity to the diffuser 80. With the example dimensions previously set forth, the angle "j" may be about 54 degrees and the angle "k" may be about 62 degrees. The diffuser 80, as described above, may be constructed of a single, molded, integral part.

It is noted that the angles "j" and "k", as well as the other diffuser dimensions set forth herein, may easily be modified in order to accommodate the specific grill size and shape, fan size and shape, and electronic device configuration presented in a particular application. The diffuser may be constructed from plastic in a conventional manner, or from any other suitable material.

Referring again to FIG. 2, it can be seen that the case rear wall section 22 may be provided with an upper hinge bracket 200. Upper hinge bracket 200 may be integrally formed with the inner metal layer 54, or may be a separate structure, attached to the inner metal layer 54 in any conventional manner. Upper hinge bracket 200 includes a circular hole 202 near its terminal end.

Rear wall section 22 may also be provided with a lower hinge bracket 204. Lower hinge bracket 204 may be attached to the inner metal layer 54 in any conventional manner. In one example, lower hinge bracket 204 may be provided with mounting brackets, such as the mounting bracket 210, which may be integrally formed with the lower hinge bracket 204. The mounting brackets may, in turn, be secured to the inner metal layer 54 by connectors, such as the connector 212. Connector 212 may be, for example, a rivet, screw or similar connector.

Lower hinge bracket 204 may be provided with an upwardly extending stud 206, having a hole 208 therein. The central axis of the hole 208 may be colinear with the upper hinge bracket hole 202, previously described. Lower hinge bracket 204 may also include a wire guide member 214 which may be integrally formed with the lower hinge bracket 204, as shown.

Rear wall section 22 may also be provided with a clasp bracket 216 which may include a hole 218 as shown. The hole may be rectangular and may conform generally to the shape and size of the diffuser catch member 144 as previously described. The terminal end 220 of the clasp bracket 216 may be angled as shown in FIG. 2. Clasp bracket 216 may be held in place against the rear wall section inner surface 50 by a plurality of tabs 222, 224, 226, which may be integrally formed with the rear wall section inner metal layer 54. Bracket 216 may include an angled portion 227. A plurality of pins 229, 231, 233, 235, which are attached to inner metal layer 54, may extend through holes in the bracket angled portion 227 in order to further secure the bracket 216. As an alternative to the mounting method described above, the bracket 216 may be attached to the rear wall section 22 in any conventional manner, such as with screws or rivets.

Rear wall section 22 may also include right and left alignment holes 228, 230. The alignment holes 228, 230 may conform generally to the shape and size of the diffuser projections 168 and 154, respectively, as previously described. The alignment holes 228, 230 may extend through the rear wall section inner metal layer 54, but not through the outer plastic layer 52. An additional hole 232 may be provided through the inner metal layer 54 as shown in FIG. 2.

FIG. 7 illustrates the diffuser 80 mounted to the case rear wall section 22 such that the rear wall section grill 40 is adjacent the exhaust end 84 of the diffuser 80 and a fan 240 is mounted against the intake end 82 of the diffuser 80. When the fan 240 is activated, it causes air to move from the interior of the case 10, into the diffuser 80 through the diffuser intake end 82, out of the diffuser through the diffuser exhaust end 84 and then out of the case through the rear wall section grill 40.

Fan 240 may be a rotary type fan, powered by a 12 volt DC brushless motor and having a plurality of fan blades 242 located within a housing 244. In a conventional manner, the housing 244 may have a circular inner shroud portion 246 which substantially conforms to the outer circumference of the area swept by the blades 242 when rotating. As is also conventional, the housing 242 may have a pair of substantially square flange members 248, 250 which define the outer profile of the fan housing. The fan 240 may have a length "e" of about 91 mm and a height "f" of about 91 mm.

Fan flange member 248 may have a plurality of holes, each located at a corner of the flange member 248 as illustrated, for example, by the holes 252, 254 which are located at the top corners of the flange member 248 as shown. Another similarly situated pair of holes 253, 255 may be located on the bottom corners of the flange member 248. The holes 252, 254, 253 and 255 may also extend through the fan flange member 250. A pair of wires 258, 260 may be provided, as shown, in order to supply electric power to the fan motor. The fan 240 may be of the type commercially available from Matsushita Electric Company of Japan, sold as Model FBA09A12H and under the trade name "PANAFLO".

When the fan is installed on the diffuser, as shown in FIG. 7, the diffuser posts 120, 124, 128 and 132, FIG. 5, engage within the fan holes 252, 254, 253 and 255, respectively. In this manner, the fan is restrained from lateral movement relative to the diffuser 80.

The fan 240 may further be restrained from longitudinal movement relative to the diffuser and held tightly against the diffuser by the diffuser fan clasps 178, 190 as shown in FIG. 7. Specifically, the fan clasp catch members 180, 192 may engage the fan flange member 248 to restrict rearward movement of the fan 240 relative to the diffuser 80. Although attachment of the fan 240 to the diffuser 80 has been described, by way of example, as being accomplished using fan clasps and posts, it is noted that the fan 240 may be attached to the diffuser 80 in any conventional manner.

The attachment of the diffuser 80 to the rear wall section 22 will now be described in detail. As shown in FIG. 7, to attach the diffuser, the diffuser upper hinge pin 158, FIG. 6, is engaged within the hole 202 in the rear wall section upper hinge bracket 200, FIG. 2. In a similar manner, the diffuser lower hinge pin 162, FIG. 6, is engaged within the hole 208 in rear wall section lower hinge bracket stud 206, FIG. 6. Accordingly, the right side of the diffuser 80 is securely attached to the rear wall section 22.

At the left side of the diffuser 80, the diffuser latch mechanism catch member 144, FIG. 5, may be engaged within the rear wall section clasp bracket hole 218, FIG. 2, as shown in FIG. 7. In this manner, the left side of the diffuser 80 is also securely held in place against the rear wall section 22. Alternatively, the left side of the diffuser 80 may be attached to the rear wall section 22 via a screw, not shown. The screw may be passed through the hole 152 in the diffuser block 150, FIG. 5, and then engaged with the rear wall section hole 232, FIG. 2.

To assist in further restraining the diffuser 80 from movement relative to the rear wall section 22, the diffuser projection 154, FIGS. 4 and 5, may engage within the rear wall section left alignment hole 230, FIG. 2. In a similar manner, the diffuser projection 168, FIG. 4, may engage within the rear wall section right alignment hole 228, FIG. 2.

As can be appreciated, use of the diffuser 80, as described above, allows a fan, such as the fan 240, to be used which has a different size and/or shape than the grill opening 40 in the rear wall section 22. This allows the grill to assume a shape which takes the best advantage of the available space on the rear wall section 22. It also allows a grill having a larger footprint than the fan to be used in order to reduce air resistance and increase airflow out of the case 10. It can be seen, for example, that, with the exemplary dimensions previously described, the grill 40 may have a length "l" of about 135 mm and a height "h" of about 75 mm while the fan 240 may have a length "e" of about 91 mm and a height "f" of about 91 mm. Accordingly, it can be seen that the grill 40 and fan 240 are able to have different shapes. It can also be seen that the grill 40 and the fan 240 may have different footprint areas. With the example dimensions listed above, the grill 40 may have a footprint area of about 101.25 square cm and the fan 240 may have a footprint area of about 82.81 square cm.

The reduction in air resistance, as described above, is important, for example, because it may allow a smaller and quieter fan to be used to move the same amount of air. Alternatively, it may allow a larger fan to operate at a slower speed which also reduces the noise produced by the fan.

Use of the diffuser 80 also allows components, such as the components 64 and 66, FIG. 2 to be located between the fan 240 and the rear wall section 22. With reference to FIGS. 4 and 5, it can be appreciated that the angled surface portion 134 allows the height "b" of the diffuser exhaust opening 84, FIG. 4, to be smaller than the height "d" of the diffuser intake opening 82, FIG. 5. This difference in height allows the components 64, 66, FIG. 2, to be located between the fan 240 and the rear wall section 22 and, thus, allows the use of a fan having a larger height "f" than would otherwise be possible.

An exemplary method of assembling the diffuser 80 to the case rear wall section 22 will now be described. Holding the diffuser 80 at approximately 90 degrees to the case rear wall section 22, the diffuser lower hinge pin 162, FIG. 6, may be inserted into the rear wall section lower hinge bracket hole 208, FIG. 2. The diffuser lower hinge pin tapered portion 164 facilitates insertion of the lower hinge pin 162 into the hole 208. After the tapered portion 164 is started into the hole 208, the diffuser upper hinge pin 158, FIG. 6, may be inserted into the rear wall section upper hinge bracket hole 202, FIG. 2. Because the lower hinge pin 162 is longer than the diffuser upper hinge pin 158, it may be conveniently started into the hole before engagement of the diffuser upper hinge pin 158 within the upper hinge bracket hole 202.

The diffuser 80 may then be lowered onto the rear wall section 22 until the diffuser upper and lower flanges 156, 160, FIG. 6, contact the rear wall section upper and lower hinge brackets 200, 204, FIG. 2, respectively. At this point, the diffuser 80 may be swung into the position shown in FIG. 7, with a forward section of the diffuser top wall portion 86 being located beneath the rear wall section upper flange 56. As this is done, the tapered diffuser latch mechanism catch 144, FIG. 5, contacts and is forced inwardly by the rear wall section clasp bracket angled portion 220, FIG. 2. As the diffuser exhaust opening 84 is seated against the rear wall section inner surface 50, the diffuser catch 144 springs into the clasp bracket hole 218, thus securely locking the diffuser exhaust opening 84 in place against the inner surface 50.

To release the diffuser from this locked position, it is merely necessary to depress the diffuser latch mechanism tab 146 in the direction of the arrow 147, FIG. 3, thus releasing the catch 144 from the hole 218 and allowing the diffuser 80 to be swung away from the rear wall section 22. In addition to allowing easy installation and removal of the diffuser 80 from the rear wall section 22, the hinged connection described above also allows quick access to the components 64, 66 as well as to other components which may be located beneath the diffuser 80 and fan 240.

Although the hinged attachment described above is a convenient way of mounting the diffuser 80, it is noted that any conventional method of mounting the diffuser 80 to the rear wall section 22 could alternatively be used. Examples of such alternative mounting methods include, but are not limited to, the use of screws, glue or snap-fit arrangements.

To attach the fan 240 to the diffuser 80, as shown in FIG. 7, the fan 240 is pressed toward the diffuser intake opening 82. As the fan moves toward the diffuser, the fan flange 248 contacts the tapered diffuser right and left fan clasp catches 180, 192, FIG. 5. This contact forces the diffuser fan clasps 178, 190 apart and allows the fan 240 to be inserted firmly against the diffuser exhaust opening 82 with the diffuser posts 120, 124, 128, 132 engaged within the holes in the fan flange 248, such as the holes 252, 254. To remove the fan, the diffuser fan clasp catch members 180, 192 may be forced apart, releasing the fan and thus allowing it to be disassembled from the diffuser 80. The fan 240 may be attached to the diffuser 80 either before or after the diffuser is attached to the rear wall section 22.

In order to prevent damage to the fan wires 258, 260 when the diffuser is hinged to the rear wall section 22, the fan wires may be routed as follows. After leaving the fan 240, the wires 258, 260 may be passed around the diffuser L-shaped member 172, and through the slot 176, FIG. 6. The wires may thereafter loop around the rear wall section lower hinge bracket stud 206, as shown in FIG. 7, and then under the lower hinge bracket wire guide 214, FIG. 2, before being connected to the fan power supply located within the case 10. In this manner, the diffuser 80 may be swung about its hinge pins 158, 162, as previously described, without damaging the wires 258, 260 and without the need to provide a significant amount of slack in the wires 258, 260.

Although the fan attachment described above is a convenient way of mounting the fan 240, it is noted that any conventional method of mounting the fan 240 to the diffuser 80 could alternatively be used. Examples of such alternative mounting methods include, but are not limited to, the use of screws, glue or snap-fit arrangements.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling system for a computer, said cooling system comprising:

a substantially closed container formed of at least a first wall section, said container having an interior and an exterior;

a grill formed in said first wall section, said grill comprising at least one opening extending through said first wall section between said interior and said exterior of said container;

a diffuser located within said container, said diffuser having a first end portion and a second end portion;

said diffuser second end portion being located adjacent said grill;

an air movement device located adjacent said diffuser first end portion; and wherein said air movement device comprises a plurality of alignment holes, and said diffuser first end portion includes a plurality of posts adapted to engage said alignment holes.

2. The system of claim 1 wherein said grill comprises a plurality of openings extending through said first wall section between said interior and said exterior of said container.

3. The system of claim 1 wherein said container is formed of a plurality of wall sections.

4. The system of claim 1 wherein said first wall section has an interior surface facing said container interior and an exterior surface facing said container exterior.

5. The system of claim 4 further including a container hinge mechanism located on said interior surface of said first wall section.

6. The system of claim 5 further including a diffuser hinge mechanism located on said diffuser.

7. The system of claim 6 wherein said diffuser hinge mechanism is adapted to engage with said container hinge mechanism.

8. The system of claim 7 wherein a bracket is located on said interior surface of said first wall section, and a clip mechanism is located on said diffuser and wherein said clip mechanism is adapted to engage said bracket.

9. The system of claim 6 wherein said container hinge mechanism comprises a plurality of holes, said diffuser hinge mechanism comprises a plurality of pins, and said plurality of pins are located within said plurality of holes.

10. The system of claim 1 wherein said diffuser further comprises a plurality of clips adapted to engage said air movement device.

11. The system of claim 1 wherein said air movement device comprises a fan assembly.

12. The system of claim 11 wherein said fan assembly includes a fan motor and a pair of electrical wires operatively attached to said fan motor and wherein said diffuser includes a clip adapted to securely hold said wires.

13. The system of claim 1 wherein said diffuser first end portion comprises a first air flow opening having a first area and said diffuser second end portion comprises a second air flow opening having a second area.

14. The system of claim 13 wherein said first area is different from said second area.

15. The system of claim 14 wherein said second area is larger than said first area.

16. The system of claim 13 wherein said first air flow opening has a shape which differs from the shape of said second air flow opening.

17. A diffuser for use in the case of a computer, said diffuser comprising:
- a first open end adapted to engage an air movement device, said first open end having a first area;
- a second open end adapted to engage a wall section of said case, said second open end having a second area;
- a first wall portion;
- a second wall portion opposite said first wall portion;
- a third wall portion connecting said first wall portion and said second wall portion;
- a fourth wall portion opposite said third wall portion, said fourth wall portion also connecting said first wall portion and said second wall portion;
- said wall portions each including a first edge portion and a second edge portion;
- said first edge portions substantially defining said diffuser first open end and said second edge portions substantially defining said diffuser second open end; and
- wherein a diffuser hinge mechanism is located on said diffuser, said diffuser hinge mechanism being adapted to engage with a case hinge mechanism.

18. The diffuser of claim 17 wherein said diffuser hinge mechanism comprises a plurality of brackets transversely attached to said third wall portion and a hinge pin transversely attached to each of said brackets.

19. The diffuser of claim 17 further including a clip mechanism attached to said fourth wall portion, said clip mechanism adapted to engage a case bracket.

20. The diffuser of claim 17 further including a plurality of clips adapted to engage said air movement device.

21. The diffuser of claim 20 wherein said clips are attached to said first edges of said third and fourth wall portions.

22. The diffuser of claim 17 further including a plurality of posts adapted to engage alignment holes in said air movement device.

23. The diffuser of claim 17 wherein said second area is larger than said first area.

24. A method of circulating air through the case of a computer, comprising the steps of:
- providing a grill in a wall of said case, said grill comprising a plurality of openings and spaces between said openings;
- providing an air movement device;
- providing a diffuser having an intake opening and an exhaust opening;
- locating said diffuser between said air movement device and said grill;
- activating said air movement device to cause air to move into said diffuser intake opening, through said diffuser, out of said diffuser exhaust opening and thereafter out of said case through said grill;
- slowing said air as it moves through said diffuser;
- wherein said grill has a first area and a first shape and said air movement device has a second area and a second shape and including the further step of providing said diffuser exhaust opening having an area and a shape substantially equal to said first area and shape and providing said diffuser intake opening having an area and a shape substantially equal to said second area and shape; and
- wherein said first area is larger than said second area.

25. A method of circulating air through the case of a computer, comprising the steps of:
- providing a grill in a wall of said case, said grill comprising a plurality of openings and spaces between said openings;
- providing an air movement device;
- providing a diffuser having an intake opening and an exhaust opening;
- locating said diffuser between said air movement device and said grill;
- activating said air movement device to cause air to move into said diffuser intake opening, through said diffuser, out of said diffuser exhaust opening and thereafter out of said case through said grill; and
- hingedly attaching said diffuser to said wall of said case.

* * * * *